US011688657B2

(12) United States Patent
Lee et al.

(10) Patent No.: US 11,688,657 B2
(45) Date of Patent: Jun. 27, 2023

(54) SEMICONDUCTOR DEVICES AND METHODS OF MANUFACTURING SEMICONDUCTOR DEVICES

(71) Applicant: Amkor Technology Singapore Holding Pte. Ltd., Valley Point (SG)

(72) Inventors: Wang Gu Lee, Seoul (KR); Gam Han Yong, Incheon (KR); Ju Hong Shin, Seoul (KR); Ji Hun Yi, Gyeonggi-do (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 116 days.

(21) Appl. No.: 17/172,210

(22) Filed: Feb. 10, 2021

(65) Prior Publication Data

US 2022/0254694 A1 Aug. 11, 2022

(51) Int. Cl.
*H01L 23/16* (2006.01)
*H01L 23/31* (2006.01)
*H01L 23/498* (2006.01)
*H01L 21/683* (2006.01)
*H01L 21/48* (2006.01)
(Continued)

(52) U.S. Cl.
CPC ............ *H01L 23/16* (2013.01); *H01L 21/486* (2013.01); *H01L 21/4853* (2013.01); *H01L 21/563* (2013.01); *H01L 21/565* (2013.01); *H01L 21/568* (2013.01); *H01L 21/6835* (2013.01); *H01L 23/3128* (2013.01); *H01L 23/3135* (2013.01); *H01L 23/49827* (2013.01); *H01L 23/49838* (2013.01); *H01L 24/16* (2013.01); *H01L 2221/68372* (2013.01); *H01L 2224/16227* (2013.01); *H01L 2924/18161* (2013.01)

(58) Field of Classification Search
CPC ...... H01L 23/16; H01L 21/563; H01L 21/565
See application file for complete search history.

(56) References Cited

U.S. PATENT DOCUMENTS 6,391,682 B1   5/2002  Tsai
7,148,560 B2  12/2006  Lee et al.
(Continued)

*Primary Examiner* — Selim U Ahmed
*Assistant Examiner* — Evan G Clinton
(74) *Attorney, Agent, or Firm* — Kevin B. Jackson

(57) ABSTRACT

In one example, a semiconductor device includes a substrate having a substrate first side, a substrate second side opposite to the substrate first side, and a conductive structure including internal terminals over the substrate first side; and external terminals over the substrate second side and coupled to the internal terminals. An electronic component includes an electronic component first side, an electronic component second side opposite to the electronic component first side, and an electronic component lateral side connecting the electronic component first side to the electronic component second side. The electronic component second side is coupled to one or more of the internal terminals. A guide structure is over the substrate first side and can include an inner portion that is laterally inward from the electronic component lateral side and an outer portion that is laterally outward from the electronic component lateral side. An underfill is interposed between the electronic component second side and the substrate first side and is over the guide structure. Other examples and related methods are also disclosed herein.

20 Claims, 12 Drawing Sheets

(51) Int. Cl.
  *H01L 21/56* (2006.01)
  *H01L 23/00* (2006.01)

(56) References Cited

U.S. PATENT DOCUMENTS

| | | |
|---|---|---|
| 8,187,921 B2 | 5/2012 | Yim et al. |
| 8,399,300 B2 | 3/2013 | Lee et al. |
| 8,399,305 B2 | 3/2013 | Huang et al. |
| 8,580,673 B2 | 11/2013 | Daubenspeck et al. |
| 9,966,321 B2 | 5/2018 | Lu et al. |
| 10,242,956 B1 | 3/2019 | Lee et al. |
| 2008/0211111 A1* | 9/2008 | Park .................. H01L 24/27 257/778 |
| 2015/0179614 A1* | 6/2015 | Murai ................. H01L 25/50 257/784 |
| 2019/0103375 A1* | 4/2019 | Huang ................. H01L 24/16 |

* cited by examiner

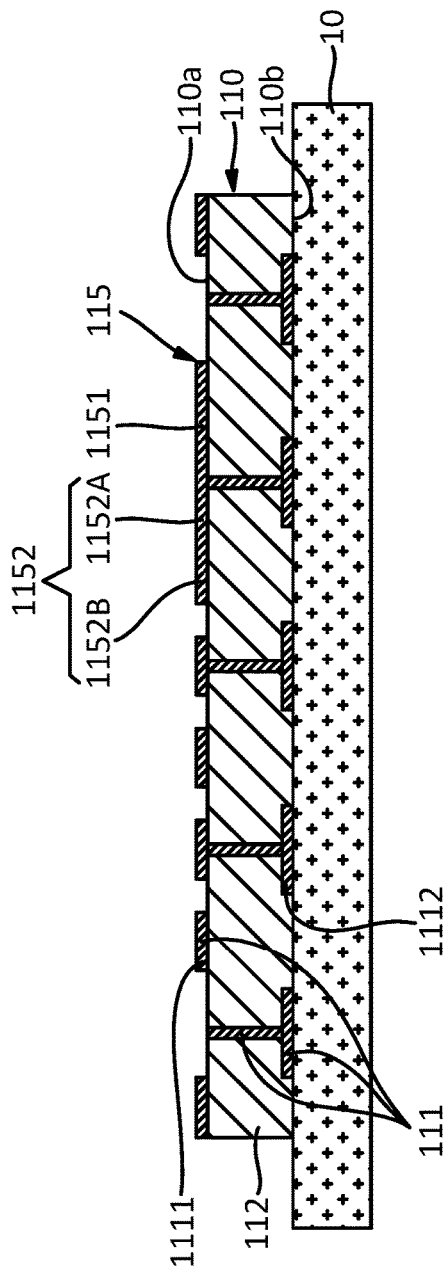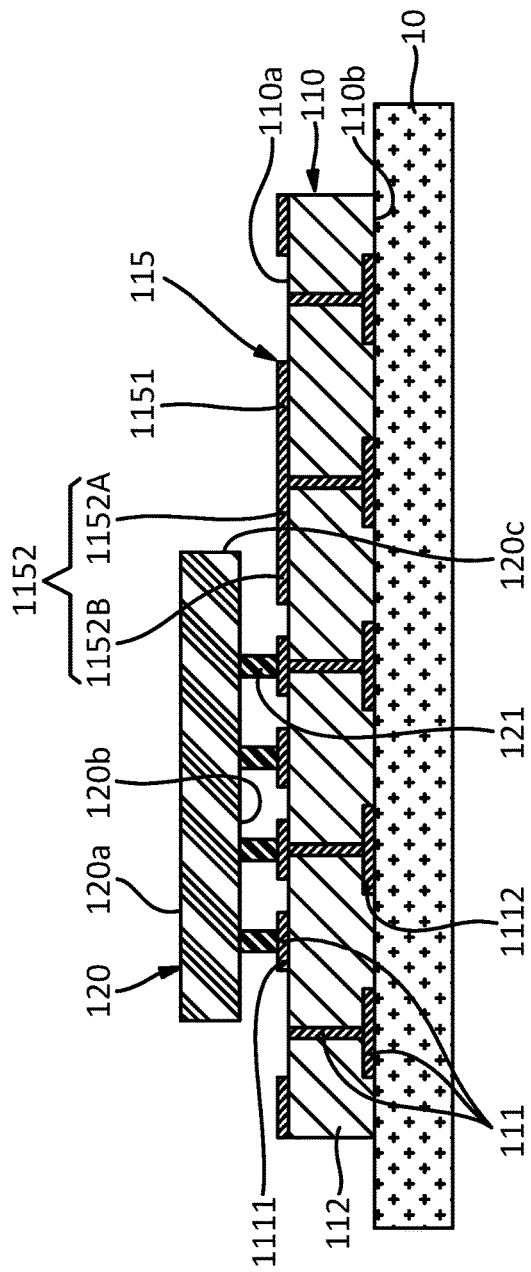

SEMICONDUCTOR DEVICES AND METHODS OF MANUFACTURING SEMICONDUCTOR DEVICES

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A, 2B, 2C, 2D, and 2E show cross-sectional views of an example method for manufacturing an example semiconductor device.

Figure 1:
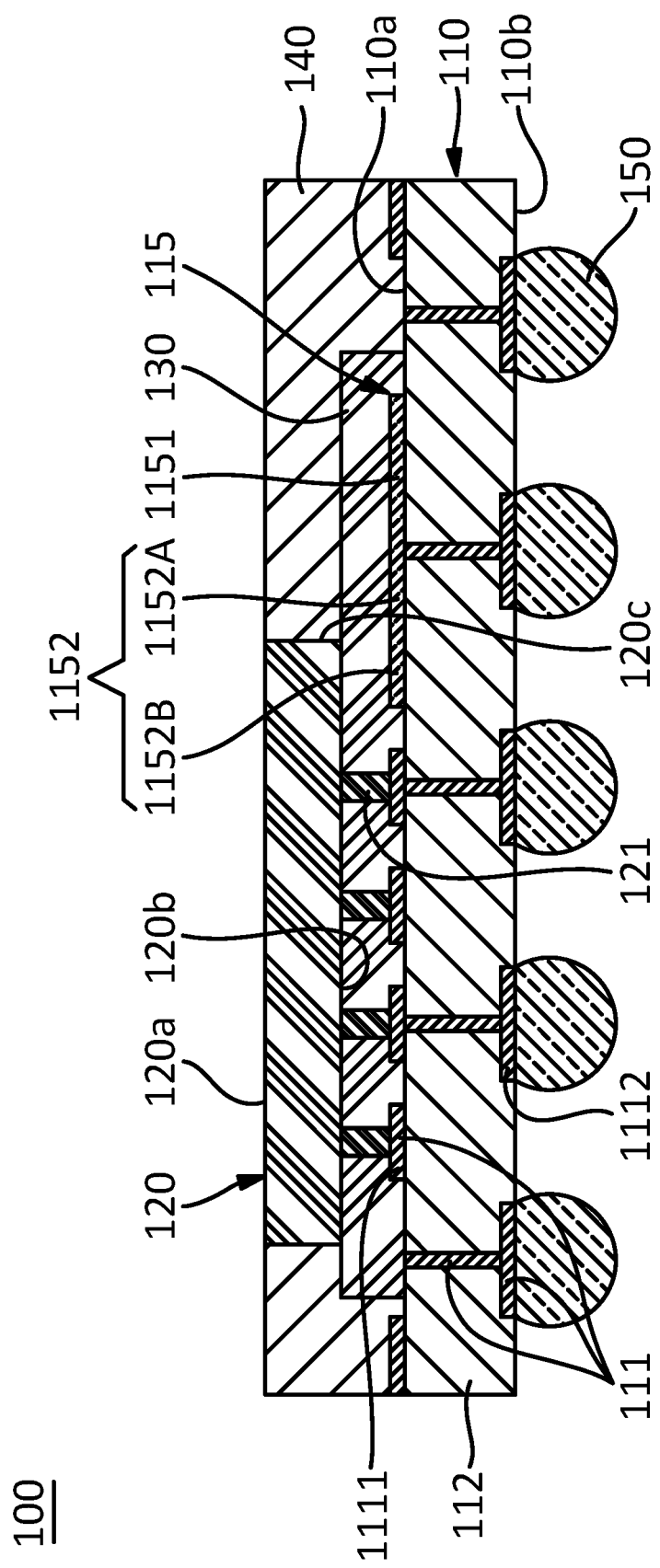
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In an example, a semiconductor device includes a substrate having a substrate first side, a substrate second side opposite to the substrate first side, and a conductive structure including internal terminals over the substrate first side; and external terminals over the substrate second side and coupled to the internal terminals. An electronic component includes an electronic component first side, an electronic component second side opposite to the electronic component first side, and an electronic component lateral side connecting the electronic component first side to the electronic component second side. The electronic component second side is coupled to one or more of the internal terminals. A guide structure is over the substrate first side and can include an inner portion that is laterally inward from the electronic component lateral side and an outer portion that is laterally outward from the electronic component lateral side. An underfill is interposed between the electronic component second side and the substrate first side and is over the guide structure. In some examples, the guide structure is part of the conductive structure. In some examples, the guide structure is not part of the conductive structure and can comprises a non-conductive material.

In an example, a semiconductor device includes a substrate comprising a substrate first side, a substrate second side opposite to the substrate first side, and a conductive structure. An electronic component comprising an electronic component first side, an electronic component second side opposite to the electronic component first side, and an electronic component lateral side connecting the electronic component first side to the electronic component second side. The electronic component second side is coupled to the conductive structure. A guide structure is over the substrate first side and comprises an outer portion that extends laterally outward from the electronic component lateral side. An underfill is interposed between the electronic component second side and the substrate first side, wherein the underfill is over the guide structure. A cover is over the at least part of the electronic component and the substrate first side.

In an example, a method of forming an electronic device includes providing a substrate having a substrate first side, a substrate second side opposite to the substrate first side, and a conductive structure comprising internal terminals over the substrate first side. The method includes coupling an electronic component to the substrate, the electronic component including an electronic component first side, an electronic component second side opposite to the electronic component first side, and an electronic component lateral side connecting the electronic component first side to the electronic component second side and defining an electronic component perimeter. The method can include coupling he electronic component second side to one or more of the internal terminals. The method includes providing a guide structure over the substrate first side and comprising an outer portion that is laterally outward from the electronic component lateral side. The method includes forming an underfill using the guide structure to guide the underfill extending underneath the electronic component. The method includes providing a cover over the at least part of the electronic component and the substrate first side. In some examples, the guide structure is provided as part of the substrate. In some examples, the guide structure is provided as part of the conductive structures. In some examples, providing the underfill comprises completely covering the guide structure.

Other examples are included in the present disclosure. Such examples may be found in the figures, in the claims, and/or in the description of the present disclosure.

FIG. 1 shows a cross-sectional view of an example semiconductor device. In the example shown in FIG. 1, semiconductor device 100 can comprise substrate 110, one or more electronic component 120, underfill 130, cover 140, and external interconnect 150.

Substrate 110 can comprise conductive structure 111, body structure 112, and guide structure 115. Conductive structure 111 can comprise internal terminal 1111 and external terminal 1112. Guide structure 115 can comprise guide base 1151 or guide rail 1152. Guide rail 1152 can comprise outer portion 1152A or inner portion 1152B. Electronic component 120 can comprise component interconnect 121. Electronic component 120 can comprise first side 120a, second side 120b and lateral side 120c.

Substrate 110, underfill 130, cover 140, and external interconnect 150 can be referred to as a semiconductor package or a package, and the semiconductor package can provide protection for electronic component 120 from external elements and/or environmental exposure. The semiconductor package can provide an electrical coupling between an external component and electronic component 120.

FIGS. 2A, 2B, 2C, 2D, and 2E show cross-sectional views of an example method for manufacturing an example semiconductor device. FIGS. 3A, 3B, 3C, and 3D and 4A and 4B show plan views of an example method for manufacturing an example semiconductor device.

Figure 2C:
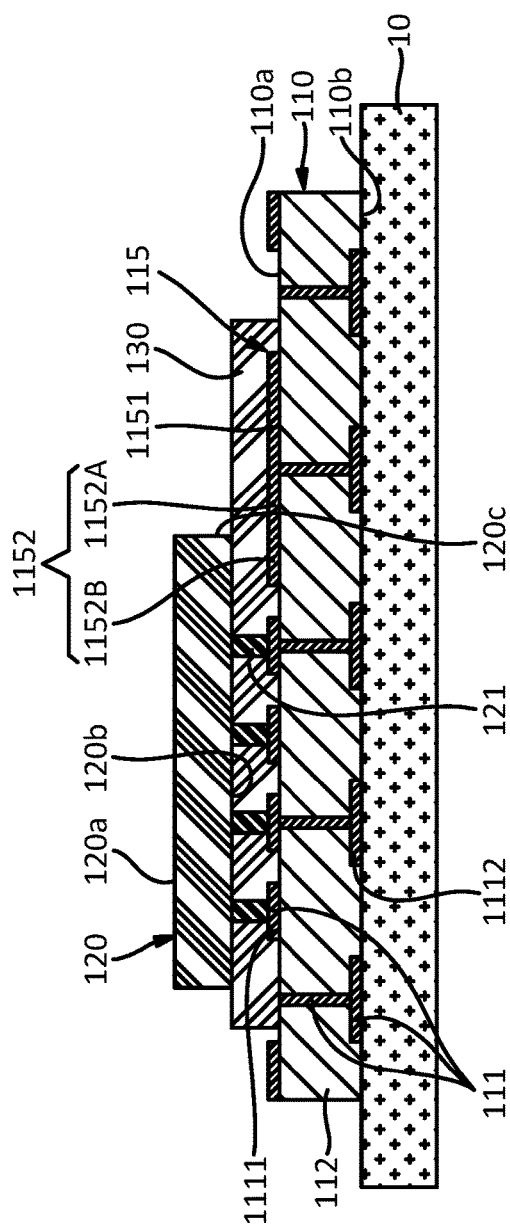
Figure 3A:
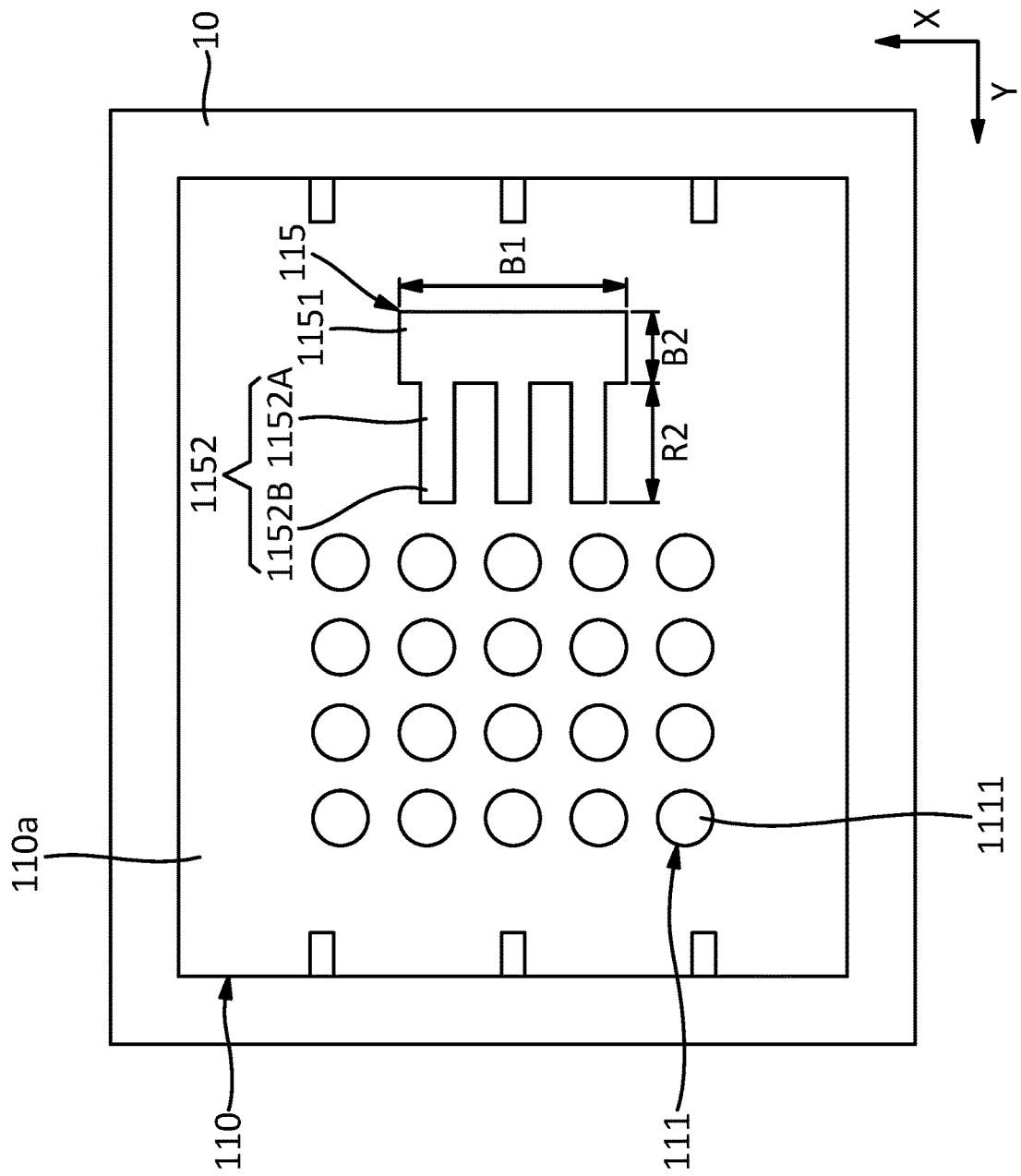
FIGS. 3A, 3B, 3C, and 3D show plan views of an example method for manufacturing an example semiconductor device.

FIG. 2A shows a cross-sectional view of electronic device 100 at an early stage of manufacture, and FIG. 3A shows a plan view.

In the example shown in FIGS. 2A and 3A, substrate 110 can be provided on carrier 10. In some examples, substrate 110 can be attached on carrier 10 through an adhesive. In some examples, multiple substrates 110 can be arrayed on carrier 10 for simultaneously production of multiple devices. In some examples, carrier 10 can comprise or be referred to as a board, wafer, panel, or strip. In some examples, carrier 10 can comprise silicon, glass, steel, stainless steel, aluminum, copper, ceramic, or a semiconductor material. In some examples, carrier 10 can comprise a rectangular shape such as the panel or strip, or a disk shape such as the wafer.

In some examples, substrate 110 can comprise or be referred to as an RDS (redistribution structure), a laminate substrate, or an RDL (redistribution layer) substrate. In some examples, substrate 110 can comprise or be referred to as a semiconductor substrate such as a semiconductor chip or a semiconductor die. In examples where substrate 110 comprises a semiconductor substrate, substrate 110 can comprise active or passive circuitry.

Substrate 110 can comprise conductive structure 111, body structure 112, and guide structure 115. In some examples, conductive structure 111 can comprise or be referred to as one or more conductors, conductive materials, conductive paths, conductive layers, redistribution layers (RDLs), wiring layers, traces, vias, or pads. In examples where substrate 110 comprises a semiconductor substrate, one or more vias of conductive structure 111 can comprise or be referred as TSV (through-semiconductor-via, through-silicon-via, etc.) In some examples, conductive structure 111 can comprise electrically conductive material such as copper, aluminum, palladium, titanium, tungsten, titanium/tungsten, nickel, gold, or silver. Conductive structure 111 can be formed by a process such as sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). In some examples, conductive structure 111 can have a thickness in the range from about 3 μm to about 10 μm. Conductive structure 111 can transmit or redistribute signals, currents, or voltages within substrate 110. Conductive structure 111 can comprise internal terminal 1111 and external terminal 1112.

Internal terminal 1111 can comprise or be referred to as a pad, land, bond pad, under bump metallization (UBM), circuit pattern, wiring layer, or metal layer. Internal terminal 1111 can be positioned on first side (top side) 110a of substrate 110 and can be exposed at the top of substrate 110. Internal terminal 1111 can be provided for electrical contact between substrate 110 and electronic component 120. In some examples, internal terminal 1111 can be coupled to external terminal 1112 through substrate 110, such as via a TSV of conductive structure 111 through body structure 112. Internal terminal 1111 can comprise an electrically conductive material such as copper, aluminum, palladium, titanium, tungsten, titanium/tungsten, nickel, gold, or silver. For example, internal terminal 1111 can be formed by a process such as sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). In some examples, internal terminal 1111 can have a thickness in the range from about 3 μm to about 10 μm.

External terminal 1112 can comprise or be referred to as a pad, land, bond pad, under bump metallization (UBM), circuit pattern, wiring layer, or metal layer. External terminal 1112 can be positioned on second side (bottom side) 110b of substrate 110 and can be exposed at the bottom of substrate 110. External terminal 1112 can be provided as electrical contact between substrate 110 and external interconnect 150. In some examples, external terminal 1112 can be coupled to internal terminal 1111 through substrate 110, such as via a TSV of conductive structure 111 through body structure 112. External terminal 1112 can comprise an electrically conductive material such as copper, aluminum, palladium, titanium, tungsten, titanium/tungsten, nickel, gold, or silver. For example, the external terminal 1112 can be formed by a process such as sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). In some examples, external terminal 1112 can have a thickness in the range from about 2 μm to about 5 μm.

Body structure 112 can comprise or be referred to as one or more dielectrics, dielectric materials, dielectric layers, passivation layers, insulation layers, protection layers. In examples where substrate 110 comprises a semiconductor substrate, body structure 112 can comprise a semiconductor material such as silicon. In some examples, body structure 112 can comprise an electrically insulating material such as a polymer, polyimide (PI), benzocyclobutene (BCB), polybenzoxazole (PBO), bismaleimide triazine (BT), a molding material, a phenolic resin, epoxy, silicone, or an acrylate polymer. In some examples, body structure 112 can be formed by a process such as spin coating, spray coating, printing, oxidation, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). In some examples body structure 112 can have a thickness in the range from about 50 µm to about 780 µm. In some examples, body structure 112 can expose a portion of conductive structure 111. For example, body structure 112 can expose internal terminal 1111 and external terminal 1112.

Guide structure 115 can be positioned on first side 110a of substrate 110. In some examples, guide structure 115 can comprise or be referred to as a guide fence. In some examples guide structure 115 can comprise a portion of conductive structure 111, or can comprise one or more layers of conductive structure 111. In some examples, guide structure 115 can comprise an electrically conductive material such as copper, aluminum, palladium, titanium, tungsten, titanium/tungsten, nickel, gold, or silver. In some examples, guide structure 115 can be a non-conductive material. In some examples, guide structure 115 can be formed by a process such as sputtering, electroless plating, electrolytic plating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). In some examples, guide structure 115 can have a thickness in the range from about 3 µm to about 10 µm. In some examples, the thickness of guide structure 115 can be similar to the thickness of internal terminal 1111. In some examples, guide structure 115 can be formed simultaneously with internal terminal 1111 as part of conductive structure 111. Guide structure 115 can guide underfill 130 from outside the footprint of electronic component 120 to underneath such footprint. Guide structure 115 can direct underfill 130 to flow well between substrate 110 and electronic component 120. In some examples, guide structure 115 can improve direction or flowability of underfill 130 to prevent voids between substrate 110 and electronic component 120. In the example shown in FIG. 3A, guide structure 115 can comprise guide base 1151 and guide rail 1152.

Figure 3B:
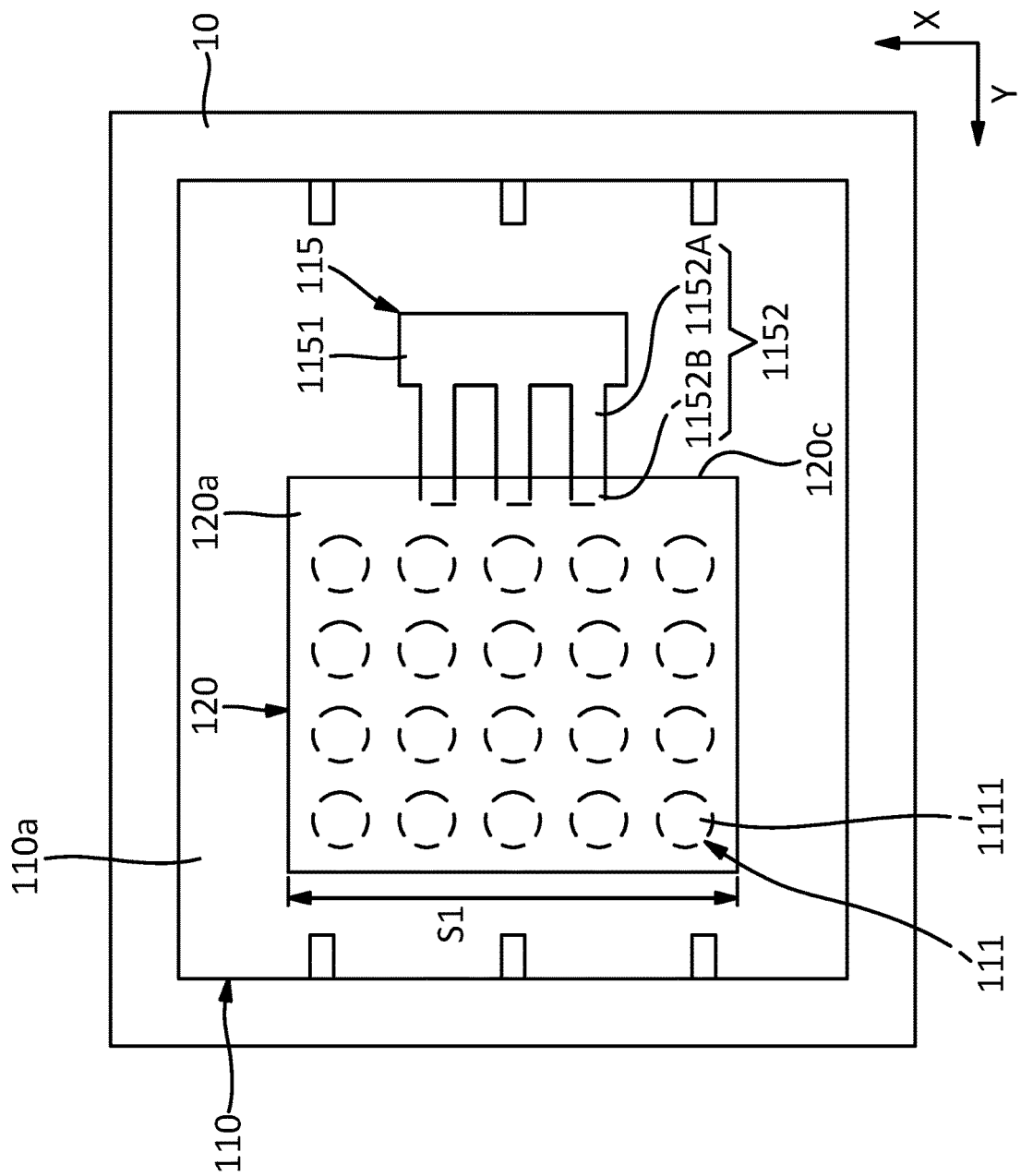

In some examples, referring to FIGS. 3A and 3B, guide base 1151 can extend parallel to lateral side 120c of electronic component 120 in a first direction X. For example, guide base 1151 can be arranged parallel to lateral side 120c through which underfill 130 is to flow. Guide base 1151 can have a length B1 smaller than a length 51 (see FIG. 3B) of electronic component 120 in the first direction X. In some examples, guide base 1151 can have a length B2 smaller than a length R2 of guide rail 1152 in a second direction Y perpendicular to the first direction X. In some examples, a distance between guide base 1151 and lateral side 120c of electronic component 120 can be smaller than a length R2 of guide rail 1152 in the second direction Y. In some examples, the distance between guide base 1151 and lateral side 120c of electronic component 120 (for example, lateral side adjacent to guide base 1151) can range from about 100 µm to about 200 µm. In some examples, the distance between guide base 1151 and lateral side 120c of electronic component 120 (for example, the side adjacent to guide base 1151) can be similar to a length of outer portion 1152A of guide rail 1152 in the second direction Y.

In some examples, referring to FIGS. 3A and 3B, guide rail 1152 can extend in a direction perpendicular to guide base 1151 or lateral component side 120c in the second direction Y. Guide rail 1152 can extend from guide base 1151 toward lateral side 120c of electronic component 120. In some examples, guide structure 115 can comprise more or less guide rails 1152 than shown. Guide rail 1152 can comprise outer portion 1152A and inner portion 1152B. Outer portion 1152A can extend from guide base 1151 outside the footprint of electronic component 120. Inner portion 11528 can extend further from outer portion 1152A within the footprint of electronic component 120. Inner portion 1152B can be spaced apart from internal terminal 1111 electrically connected to electronic component 120. In some examples, outer portion 1152A can have a length greater than a length of inner portion 11528 in the second direction Y.

Figure 4A:
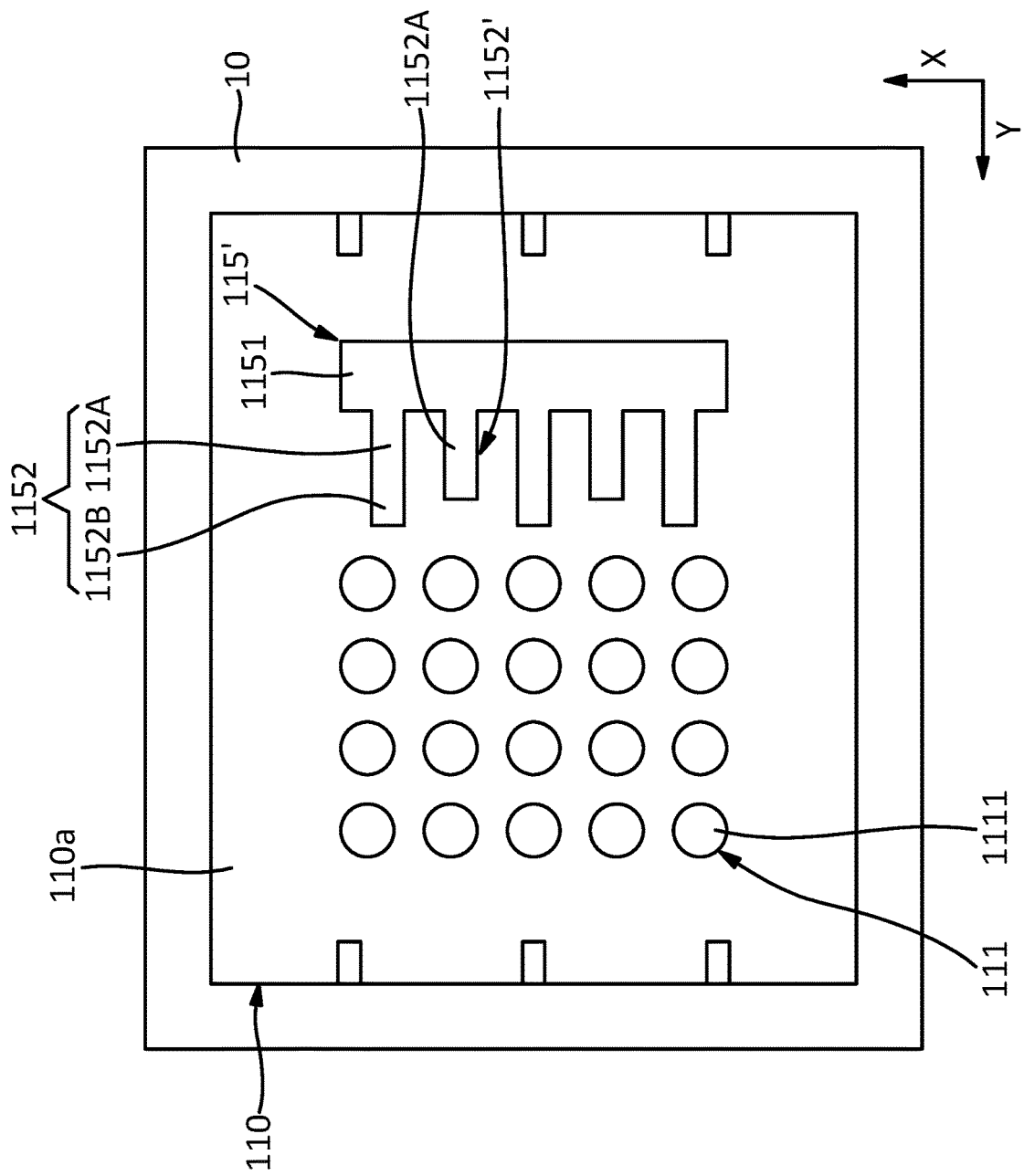
FIGS. 4A and 4B show plan views of an example method for manufacturing an example semiconductor device.

In the example shown in FIG. 4A, guide structure 115' can comprise a guide base 115 and guide rails 1152 and 1152'. Guide rails 1152 and 1152' can comprise first guide rail 1152 comprising outer portion 1152A and inner portion 1152B, and second guide rail 1152' comprising only outer portion 1152A. In some examples, first guide rail 1152 and second guide rail 1152' can be alternately arranged. For example, first guide rail 1152 can be arranged at each of both ends, and second guide rail 1152' can be arranged between first guide rails 1152.

In some examples, substrate 110 can be a redistribution layer ("RDL") substrate. RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer(s) can comprise silicon nitride ($Si_3N_4$), silicon oxide ($SiO_2$), and/or SiON. The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate. Other substrates in this disclosure can also comprise an RDL substrate.

In some examples, substrate 110 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, and/or other inorganic particles for rigidity and/or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can rereferred to as a printed circuit board (PCB) or a laminate substrate. Such pre-formed substrate can be formed through a semi-additive or modified-semi-additive process. Other substrates in this disclosure can also comprise a pre-formed substrate.

FIG. 2B shows a cross-sectional view of semiconductor device 100 at a later stage of manufacture, and FIG. 3B shows a plan view. In the example shown in FIGS. 2B and 3B, electronic component 120 can be provided on substrate 110. Electronic component 120 can be coupled to conductive structure 111 of substrate 110. In some examples, electronic component 120 can comprise or be referred to as a semiconductor die, a semiconductor chip, or a semiconductor package, such as a chip-scale package. Electronic component 120 can comprise, for example, a semiconductor material such as silicon (Si). Electronic component 120 can comprise active devices such as a power component or a transistor (for example, FET). For example, electronic component 120 can comprise electrical circuits such as a memory, a digital signal processor (DSP), a microprocessor, a network processor, a power management processor, an audio processor, an RF circuit, a wireless baseband system-on-chip (SoC) processor, a sensor, and an application specific integrated circuit. Electronic component 120 can be electrically connected to conductive structure 111 by, for example, in a manner such as a mass reflow manner, a thermal compression manner, or a laser bonding manner. Electronic component 120 can have a height in the range from about 50 μm to about 780 μm.

Electronic Component

Electronic component 120 can comprise first side 120a, second side 120b opposite to the first side (for example, side facing toward first side 110a of substrate 110), and lateral side 120c extending between first side 120a and second side 120b. Electronic component 120 can be mounted on first side 110a of substrate 110 and can cover a portion of guide structure 115. In some examples, electronic component 120 can cover inner portion 1152B of guide rail 1152. Inner portion 1152B of guide rail 1152 can extend under electronic component 120. Second side 120b of electronic component 120 can face inner portion 1152B of guide rail 1152. Guide rail 1152 can be divided into outer portion 1152A and inner portion 1152B by lateral side 120c (for example, lateral side adjacent to guide structure 115) of electronic component 120.

Electronic component 120 can comprise component interconnect 121. Component interconnect 121 can be located at second side 120b of electronic component 120. In some examples, component interconnect 121 can comprise a conductive ball such as a solder ball, a conductive pillar such as a copper pillar, a conductive post with a solder cap formed over the copper pillar, and/or a conductive bump. Component interconnect 121 can be coupled to internal terminal 1111 of conductive structure 111. Component interconnect 121 can provide electrical contact between electronic component 120 and substrate 110. In some examples, component interconnect 121 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. Component interconnect 121 can be formed using, for example, ball drop, screen printing, or electroplating processes.

Figure 4B:
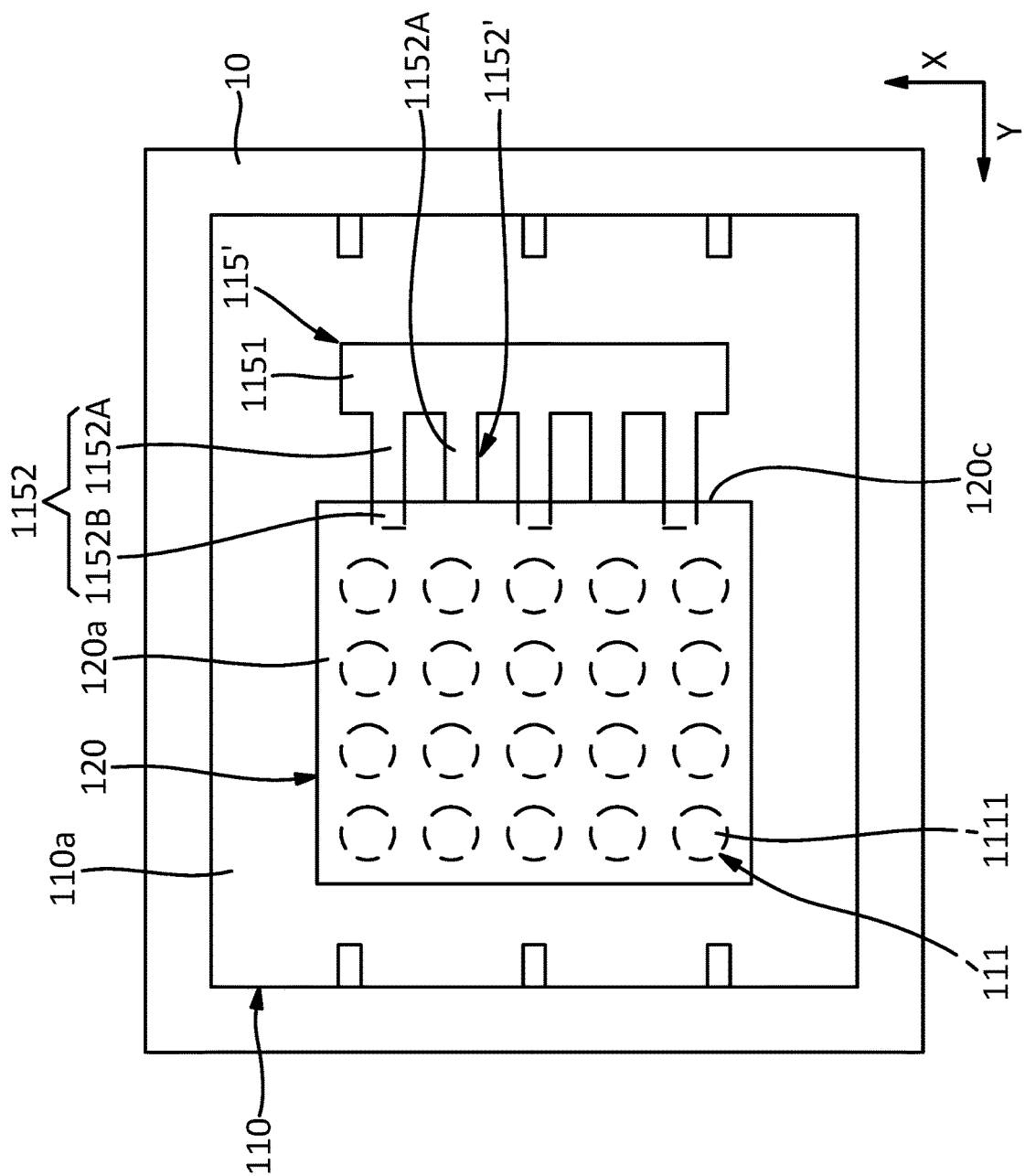

In the example shown in FIG. 4B, electronic component 120 can be mounted on first side 110a of substrate 110 and can cover a portion of guide structure 115'. Electronic component 120 can cover inner portion 1152B of first guide rail 1152. In some examples, electronic component 120 does not cover second guide rail 1152'. Lateral side 120c of electronic component 120 can be proximate to the end of second guide rail 1152.

Figure 3C:
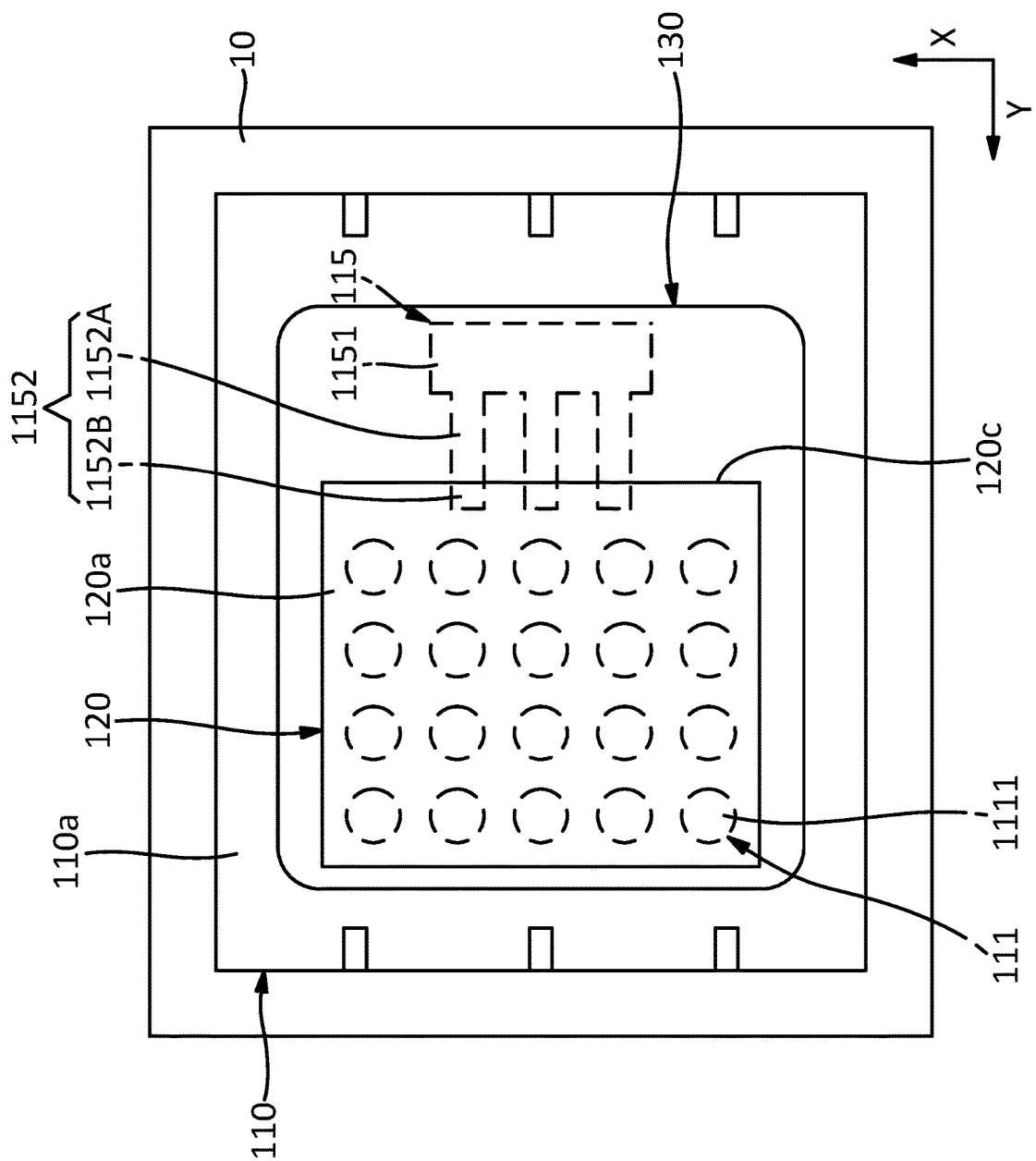

FIG. 2C shows a cross-sectional view of semiconductor device 100 at a later stage of manufacture, and FIG. 3C shows a plan view. In the example shown in FIGS. 2C and 3C, underfill 130 can be provided between substrate 110 and electronic component 120. Underfill 130 can cover internal terminal 1111, component terminal 121, and guide structure 115. In some examples, underfill 130 is interposed between guide structure 115 and electronic component 120. In some examples, underfill 130 can comprise or be referred to as a capillary underfill, protective material, epoxy, polymer, or fluxing underfill. In some examples, underfill 130 can be dispensed on or adjacent to guide base 1151 or outer portion 1152A of guide rail 1152. Then, underfill 130 can flow between substrate 110 and electronic component 120 along guide rail 1152 (for example, from outer portion 1152A to inner portion 1152B). Guide structure 115 can serve to guide underfill 130 towards electronic component 120 across substrate 110, permitting more underfill 130 to reach and extend under the footprint of electronic component 120 for better and more uniform coverage. In the example shown in FIG. 3C, inner portion 1152B of guide rail 1152 can extend under electronic component 120 to continue guiding underfill 130 within the footprint of, and past the edge of, electronic component 120. Underfill 130 can have a height in the range from about 5 µm to about 50 µm.

Figure 2D:
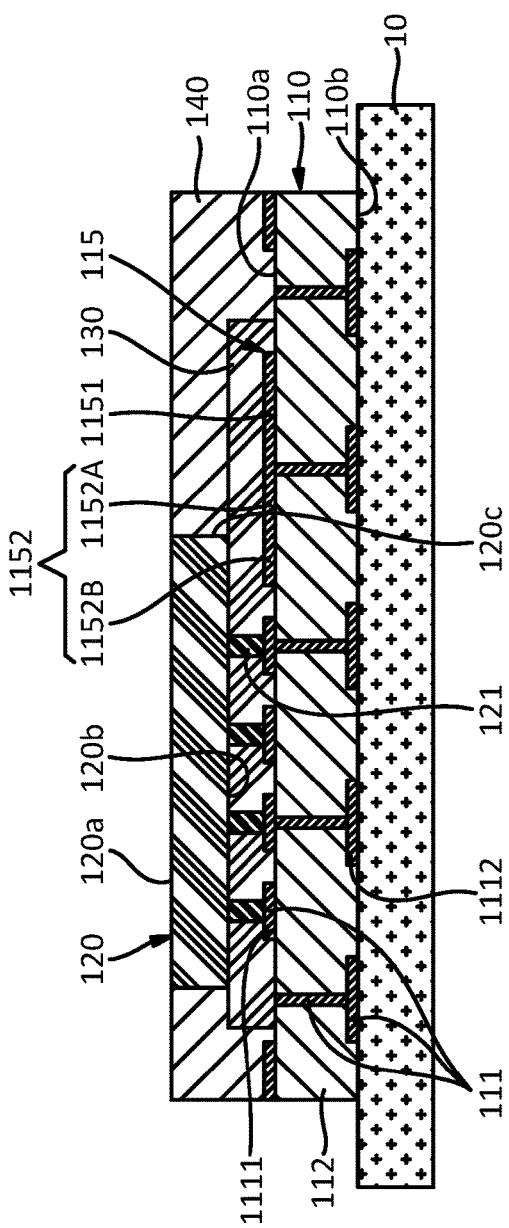
Figure 3D:
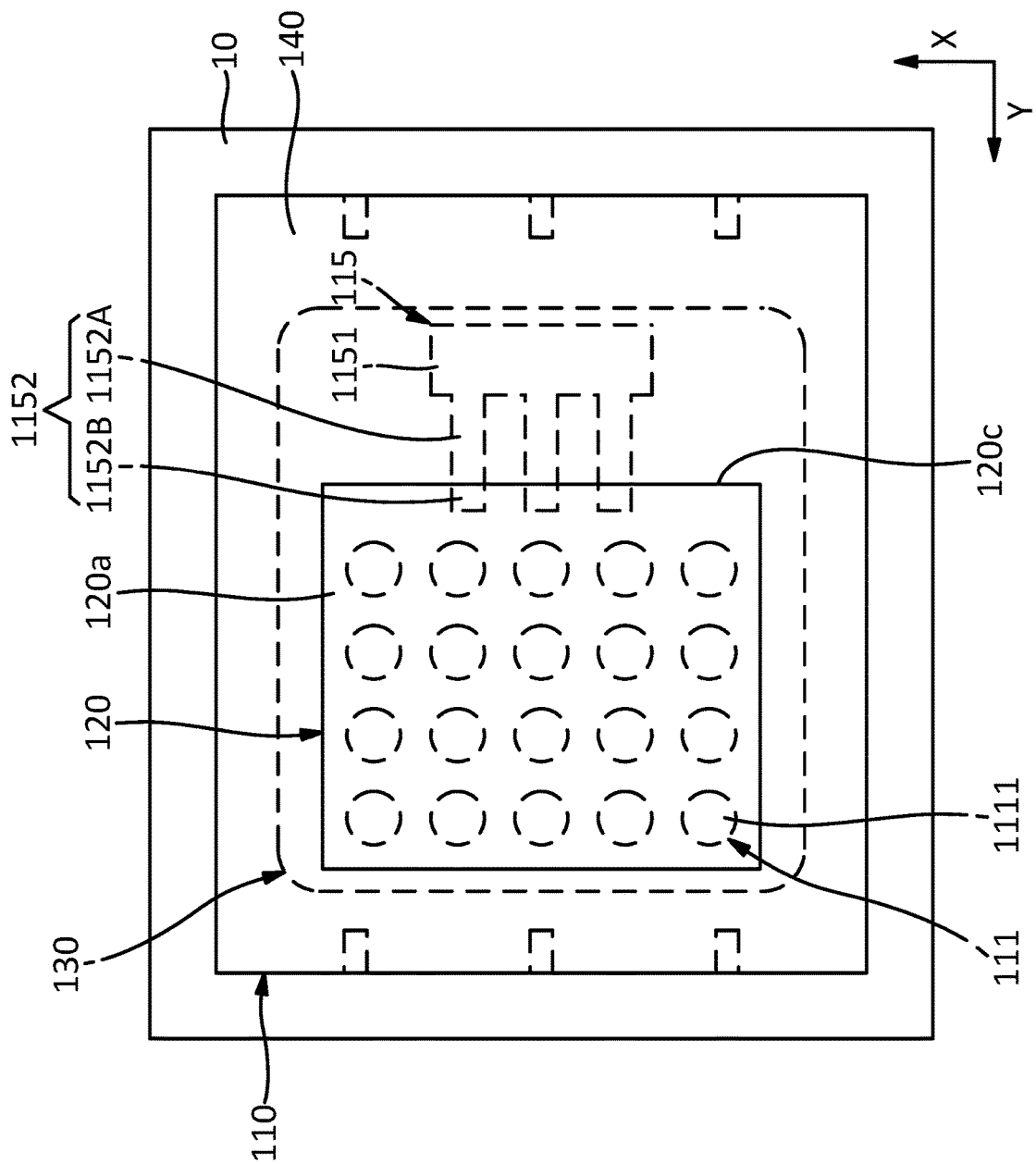

FIG. 2D shows a cross-sectional view of semiconductor device 100 at a later stage of manufacture, and FIG. 3D shows a plan view. In the examples shown in FIGS. 2D and 3D, cover 140 can be provided to cover or encapsulate electronic component 120 on substrate 110. In some examples, cover 140 can cover or encapsulate side 120a or lateral sides 120c of electronic component 120, or underfill 130, on the first side of the substrate 110. In some examples, cover 140 leaves exposed first side 120a of electronic component 120. In some examples, a top side of cover 140 can be coplanar with first side 120a of electronic component 120. In some examples, cover 140 can initially cover first side 120a of electronic component 120, and then upper portions of cover 140 and electronic component 120 can be thinned, such as by grinding, to define and expose first side 120a of electronic component 120. In some examples, cover 140 can comprise or be referred to as an encapsulant, a protective material, a dielectric, a mold compound, an epoxy mold compound (EMC), or a package body. Cover 140 can comprise a variety of encapsulating or molding materials (for example, a resin, a polymer composite material, a polymer having a filler, an epoxy resin, an epoxy resin having a filler, epoxy acrylate having a filler, a silicone resin, combinations of above materials, or equivalents of above materials, etc.). Cover 140 can be formed by various methods, for example, compression molding, liquid encapsulant molding, vacuum lamination, paste printing, or film assist molding. In some examples, cover 140 can be a lid comprising a metal. In some examples, cover 140 need not contact lateral sides 120c of electronic component 120. In some examples, cover 140 can have a height in the range from about 50 µm to about 800 µm.

Figure 2E:
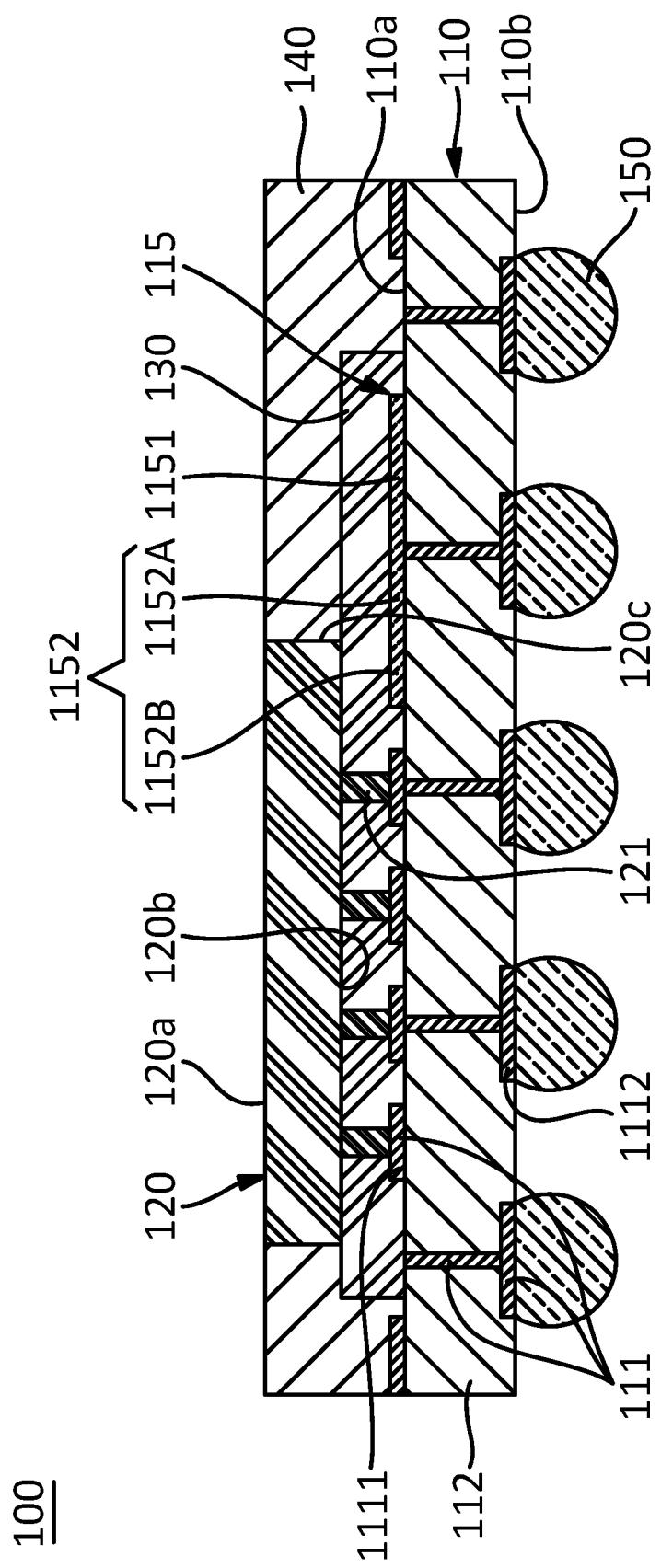

FIG. 2E shows a cross-sectional view of semiconductor device 100 at a later stage of manufacture. In the example shown in FIG. 2E, carrier 10 can be removed, and external interconnect 150 can be provided on second side 120b of substrate 110. In some examples, carrier 10 on second side 120b of substrate 110 can be removed. For example, carrier 20 can be removed from substrate 110 by grinding, heating, chemical substance, ultraviolet (UV) or physical force. External terminal 1112 of substrate 110 can be exposed. External interconnect 150 can be electrically connected to exposed external terminal 1112 to complete semiconductor device 100. In some examples, external interconnect 150 can comprise or be referred to as a conductive bump, ball, pillar, or post. Component interconnect 150 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. External interconnect 150 can be formed by, for example, ball drop, screen printing, or electroplating. External interconnect 150 can have a height in the range from about 30 µm to about 500 µm. External interconnect 150 can be provided as an electrical connection path between semiconductor device 100 and the external component.

Figure 5:
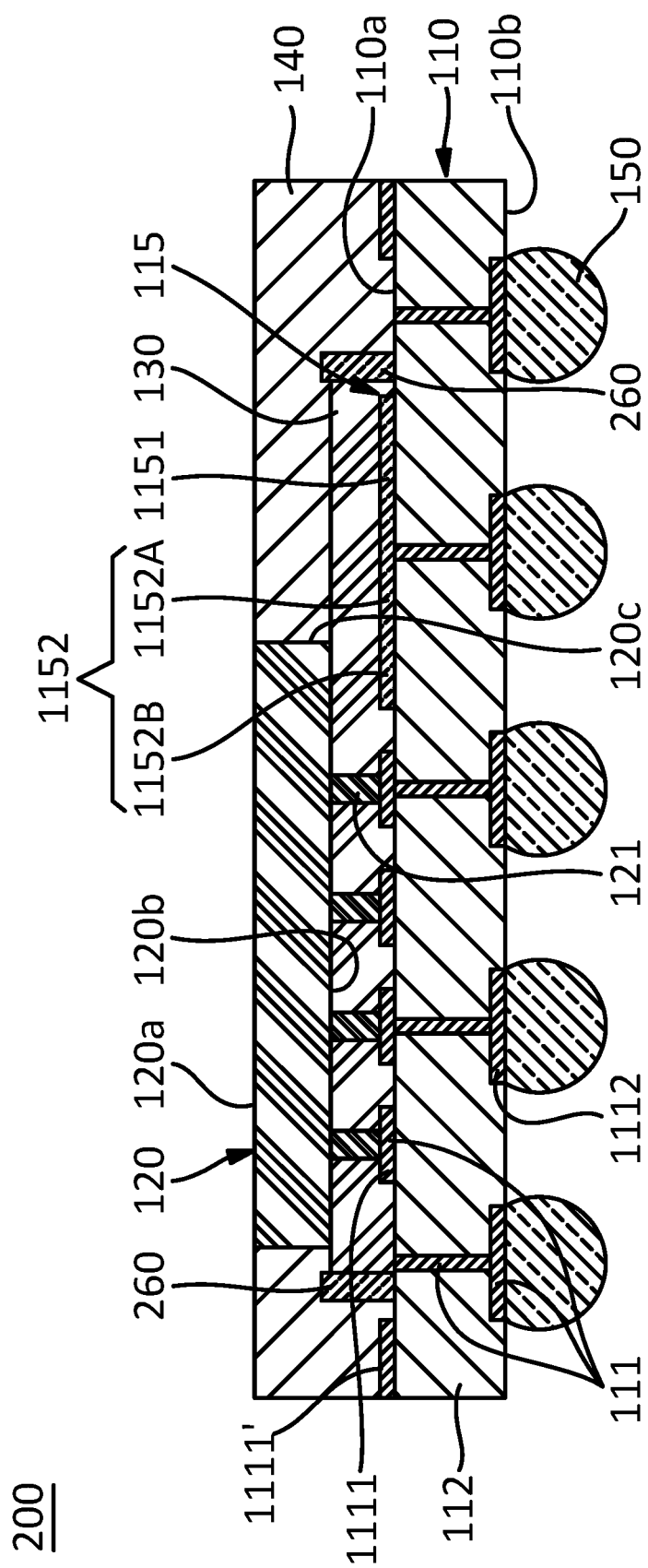
FIG. 5 shows a cross-sectional view of an example semiconductor device.
Figure 6:
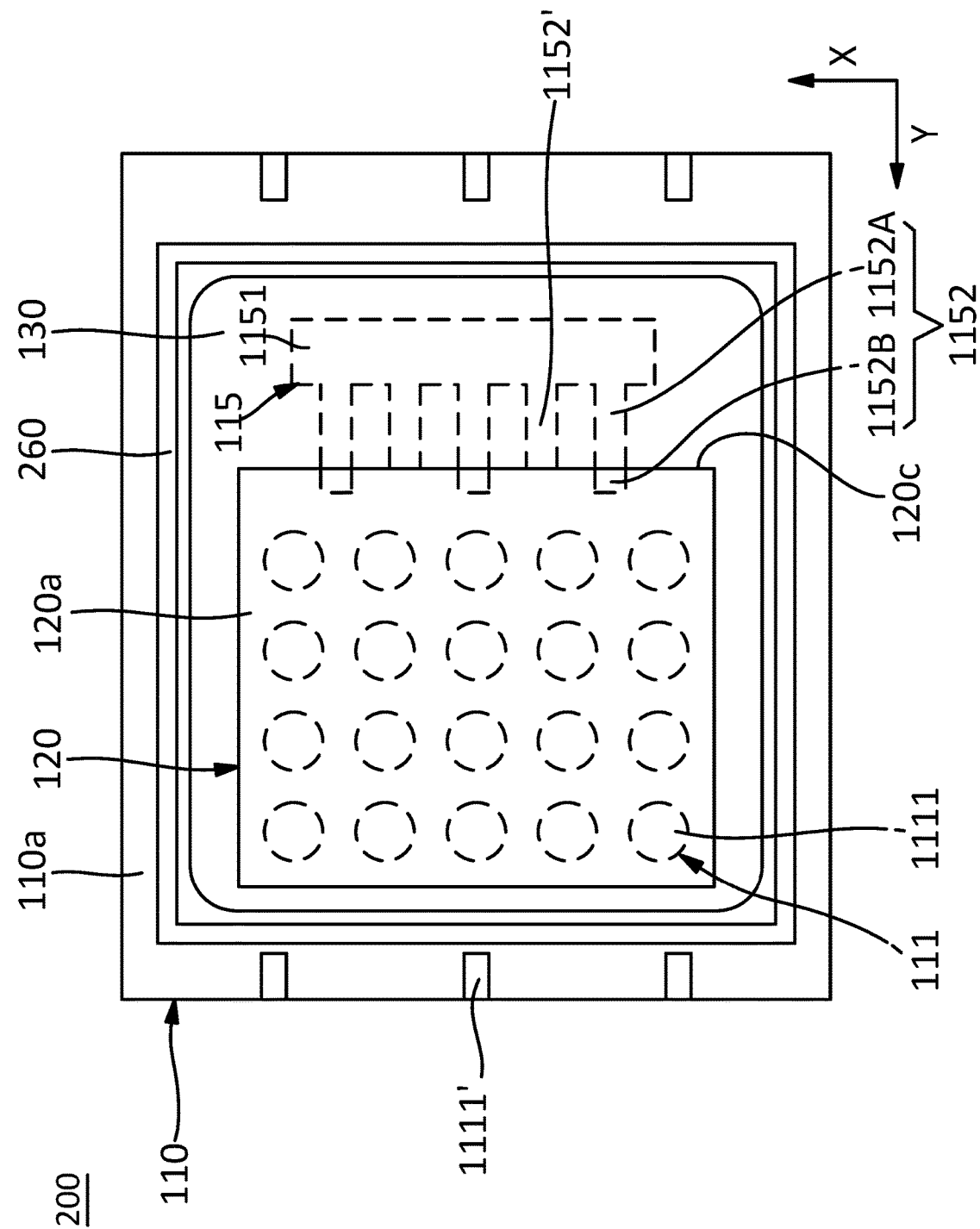
FIG. 6 shows a plan view of an example semiconductor device.

FIG. 5 shows a cross-sectional view of an example semiconductor device. FIG. 6 shows a plan view of an example semiconductor device. In the semiconductor device shown in FIG. 6, cover 140 can be excluded from semiconductor device of FIG. 5. In the example shown in FIG. 5, semiconductor device 200 can comprise substrate 110, electronic component 120, underfill 130, cover 140, external interconnect 150, and dam structure 260.

Semiconductor device 200 can comprise or share corresponding elements, features, materials, formation processes, or descriptions similar to those of others described here throughout FIGS. 1-4, such as with respect to semiconductor device 100. Semiconductor device 200 can comprise dam structure 260.

In some examples, dam structure 260 can comprise or be referred to as a dam pattern, fence, or barrier. In some examples, dam structure 260 can comprise an electrically conductive material such as copper, aluminum, palladium, titanium, tungsten, titanium/tungsten, nickel, gold, or silver. In some examples, dam structure 260 can comprise an electrically insulating material such as a polymer, polyimide (PI), silicone, or epoxy. In some examples, dam structure 260 can be formed by a process such as sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD).

In the example shown in FIGS. 5 and 6, dam structure 260 can be formed to laterally surround electronic component 120 or guide structure 115. In some examples, dam structure 260 can continuously surround electronic component 120 and guide structure 115. In some examples, dam structure 260 can comprise discontinuities along its perimeter. Dam structure 260 can be adjacent to, or can contact, guide base 1151 of guide structure 115. Underfill 130 can be arranged inside dam structure 260. In some examples, dam structure 260 can prevent underfill 130 from overflowing or flowing to undesired areas. Dam structure 260 can prevent underfill 130 from covering internal terminal 1111' over substrate 110. Dam structure 260 can be covered or encapsulated by cover 140. In some examples, dam structure 260 can have a thickness greater than a thickness of guide structure 115 or a thickness of underfill 130. In some examples, dam structure 260 can have a height in the range from about 10 µm to about 100 µm.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. A semiconductor device, comprising:
   a substrate comprising:
      a substrate first side;
      a substrate second side opposite to the substrate first side; and
      a conductive structure comprising:
         internal terminals over the substrate first side; and
         external terminals over the substrate second side and coupled to the internal terminals;

an electronic component comprising:
  an electronic component first side;
  an electronic component second side opposite to the electronic component first side; and
  an electronic component lateral side connecting the electronic component first side to the electronic component second side;
  wherein the electronic component second side is coupled to one or more of the internal terminals;
a guide structure over the substrate first side and comprising
  a first guide rail comprising:
    a first length;
    a first inner portion that is laterally inward from the electronic component lateral side; and
    a first outer portion that is laterally outward from the electronic component lateral side;
  a second guide rail laterally separated from the first guide rail and comprising:
    a second length; and
    a second outer portion that is laterally outward from the electronic component lateral side; and
  a guide base coupled to the first guide rail and the second guide rail;
  wherein:
    the electronic component comprises an electronic component length in a first direction generally perpendicular to the first guide rail; and
    the guide base comprises a guide base first length in the first direction and a guide base second length in a second direction generally parallel to the first guide rail;
and
an underfill interposed between the electronic component second side and the substrate first side, wherein the underfill is over the guide structure.

2. The semiconductor device of claim 1, wherein:
the underfill extends further from the electronic component lateral side than from another lateral side of the electronic component.

3. The semiconductor device of claim 1, wherein:
the guide structure is part of the conductive structure.

4. The semiconductor device of claim 1, wherein:
the guide structure is coupled to one or more of the external terminals.

5. The semiconductor device of claim 4, wherein:
the first guide rail and the second guide rail are interposed between the guide base and the electronic component lateral side.

6. The semiconductor device of claim 1, wherein:
the second guide rail comprises a second inner portion that is laterally inward from the electronic component lateral side.

7. The semiconductor device of claim 1, wherein:
the second length is different than the first length.

8. The semiconductor device of claim 1, wherein:
the guide structure further comprises a third guide rail coupled to the guide base;
the third guide rail comprises a third length;
the second guide rail is interposed between the first guide rail and the third guide rail; and
the second length is less than the first length and the third length.

9. The semiconductor device of claim 1, wherein:
the guide base first length is less than the electronic component length; and
the guide base second length is less than the guide base first length.

10. The semiconductor device of claim 1, further comprising:
a dam structure over the substrate first side and laterally surrounding the electronic component and the guide structure.

11. The semiconductor device of claim 1, further comprising:
a cover encapsulating at least part of the electronic component, the underfill, and the substrate.

12. A semiconductor device, comprising:
a substrate comprising:
  a substrate first side;
  a substrate second side opposite to the substrate first side; and
  a conductive structure;
an electronic component comprising:
  an electronic component first side;
  an electronic component second side opposite to the electronic component first side; and
  an electronic component lateral side connecting the electronic component first side to the electronic component second side;
  wherein the electronic component second side is coupled to the conductive structure;
a guide structure over the substrate first side and comprising:
  a guide base; and
  guide rails coupled to the guide base and including a first guide rail comprising:
    a first outer portion that extends laterally outward from the electronic component lateral side; and
    a first inner portion that extends laterally underneath the electronic component;
  wherein:
    the conductive structure comprises inner terminals adjacent to the substrate first side and outer terminals adjacent to the substrate second side; and
    the guide structure is coupled to one or more of the outer terminals;
an underfill interposed between the electronic component second side and the substrate first side, wherein the underfill is over the guide structure; and
a cover over at least part of the electronic component and the substrate first side.

13. The semiconductor device of claim 12, wherein:
the guide structure comprises a non-conductive material.

14. The semiconductor device of claim 12, wherein:
the guide structure comprises:
  a guide base comprising a guide base first side; and
  a second guide rail coupled to the guide base first side and comprising a second outer portion that is laterally outward from the electronic component lateral side;
the first guide rail is coupled to the guide base first side and is laterally separated from the second guide rail;
the guide base comprises a guide base first length in a first direction and a guide base second length in a second direction generally parallel to the first guide rail; and
the guide base second length is less than the guide base first length.

15. The semiconductor device of claim 12, wherein:
the guide rails comprise different lengths so that at least one guide rail does not extend underneath the electronic component second side.

16. The semiconductor device of claim 12, further comprising:
  a dam structure over the substrate first side and laterally surrounding the electronic component, the guide structure, and the underfill.

17. A method of forming an electronic device, comprising:
  providing a substrate comprising:
    a substrate first side;
    a substrate second side opposite to the substrate first side; and
    a conductive structure comprising internal terminals over the substrate first side;
  coupling an electronic component to the substrate, the electronic component comprising:
    an electronic component first side;
    an electronic component second side opposite to the electronic component first side; and
    an electronic component lateral side connecting the electronic component first side to the electronic component second side and defining an electronic component perimeter;
    wherein the electronic component second side is coupled to one or more of the internal terminals;
  providing a guide structure over the substrate first side and comprising:
    a first guide rail comprising:
      a first length;
      a first inner portion that is laterally inward from the electronic component lateral side; and
      a first outer portion that is laterally outward from the electronic component lateral side;
    a second guide rail laterally separated from the first guide rail and comprising:
      a second length; and
      a second outer portion that is laterally outward from the electronic component lateral side; and
    a guide base coupled to the first guide rail and the second guide rail;
  wherein:
    the electronic component comprises an electronic component length in a first direction generally perpendicular to the first guide rail; and
    the guide base comprises a guide base first length in the first direction and a guide base second length in a second direction generally parallel to the first guide rail;
  forming an underfill using the guide structure to guide the underfill extending underneath the electronic component; and
  providing a cover over at least part of the electronic component and the substrate first side.

18. The method of claim 17, wherein:
providing the guide structure comprises:
  providing the guide base first length less than the electronic component length; and
  providing the guide base second length is less than the guide base first length.

19. The method of claim 17, wherein:
the method comprises providing a finished electronic device; and
the guide structure remains as part of the finished electronic device.

20. The method of claim 17, wherein:
the method further comprises:
  providing a dam structure over the substrate first side and laterally surrounding the electronic component, the guide structure, and the underfill.

* * * * *